(12) United States Patent
Summers

(10) Patent No.: US 6,773,543 B2
(45) Date of Patent: Aug. 10, 2004

(54) METHOD AND APPARATUS FOR THE MULTIPLEXED ACQUISITION OF A BARE DIE FROM A WAFER

(75) Inventor: Michael A. Summers, Santa Cruz, CA (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 10/430,621

(22) Filed: May 6, 2003

(65) Prior Publication Data

US 2003/0211652 A1 Nov. 13, 2003

Related U.S. Application Data

(60) Provisional application No. 60/377,835, filed on May 7, 2002.

(51) Int. Cl.$^7$ ............................................. B32B 35/00
(52) U.S. Cl. ...................... 156/344; 156/584; 29/426.3; 29/426.6; 438/464
(58) Field of Search .............................. 438/33, 68, 113, 438/114, 464, 465, 976; 156/344, 584; 29/426.1, 426.3, 426.5, 426.6, 762

(56) References Cited

U.S. PATENT DOCUMENTS

| | | | |
|---|---|---|---|
| 5,596,270 A | * | 1/1997 | Mitsui ...................... 324/158.1 |
| 5,671,530 A | | 9/1997 | Combs et al. |
| 5,976,306 A | | 11/1999 | Davis et al. |
| 6,016,358 A | * | 1/2000 | Balamurugan ............... 382/151 |
| 6,173,750 B1 | | 1/2001 | Davis et al. |
| 6,554,128 B1 | | 4/2003 | Davis et al. |
| 6,585,471 B2 | * | 7/2003 | Odajima et al. ............ 414/403 |

* cited by examiner

*Primary Examiner*—Mark A. Osele
(74) *Attorney, Agent, or Firm*—Basch & Nickerson LLP; Duane C. Basch

(57) ABSTRACT

A method for the co-processing of bare die removal from a semiconductor wafer for the improved throughput of the extraction of die from a wafer for subsequent placement onto a substrate. The apparatus includes a pick head containing a nozzle having a suction port within that secures the bare die as it is removed from the wafer. The intermediate holding station has a plurality of nozzles, each having a vacuum port to secure and buffer a multitude of flipped die that are transferred from the pick nozzle. Vacuum flow valves enable the release and transfer of the bare die. Having a multiple of nozzles provides a buffer for the die as they are subsequently transitioned from the pick nozzle, queued within the intermediate transfer station and loaded in tandem onto a die shuttle.

10 Claims, 4 Drawing Sheets

METHOD AND APPARATUS FOR THE MULTIPLEXED ACQUISITION OF A BARE DIE FROM A WAFER

CROSS REFERENCE

The following related application is hereby incorporated by reference for its teachings. Provisional Application for Patent 60/377,835, "METHOD FOR ACCELERATED BARE DIE REMOVAL FROM A WAFER", filed May 7, 2002 by Michael Summers.

Also incorporated herein by reference for their teachings are U.S. Pat. No. 5,976,306 issued Nov. 2, 1999, U.S. Pat. No. 6,173,750: issued Jan. 16, 2001, and U.S. Pat. No. 6,554,128 issued Apr. 29, 2003, all of which are assigned to the assignee of the instant application.

The present invention relates generally to the delivery of bare die for placement onto printed circuit boards during the assembly process and more specifically, a method and apparatus for concurrently removing, inverting and transporting flip-chips from a semiconductor wafer to an automated pick-and-place machine for subsequent placement onto a circuit board substrate. More particularly, the invention relates to the accelerated throughput of the direct bare die feeding process which performs the function of removing known to be good die from a sawed wafer disposed on a adhesive coated film, inverting, so as the active surface is downward, and subsequently conveying to a distal pick-up location that is accessible to the assembly machine.

BACKGROUND OF THE INVENTION

The present invention is an improvement of the throughput characteristics of a die extracting and delivery system associated with automated pick and place equipment, particularly those systems requiring the extraction, flipping and placement of numerous die or components at high speeds. It can be appreciated that methods for removing and delivering bare die from a wafer have been in use for many years. The present invention includes, among other aspects and features, a novel method for tandem handling of a multitude of die employing a linear array of vacuum nozzles for buffering, transferring and transporting the die.

Typically, the method for delivering bare die in the production of printed circuit boards (PCB), is to use a conventional tape and reel feeder whereby the bare die are "prepackaged" by first removing them from the wafer and predisposing them within a linear strip having pockets equidistantly embossed therewithin and covered by a thin film or cover tape. Alternative means would include placing the die into a matrix tray which has been portioned for each die. The primary concern with traditional methods for delivering bare die is the costs and reliability associated with placing the die into the embossed tape and then having to remove the flip-chip and discard the cover and pocket tape as waste during the assembly process. The preferred method to this double handling would eliminate the pre-packaging of the die by extracting the die directly from the wafer, placing it onto a conveyance means and presenting the die directly to a placement machine. An example of such a direct die feeder is shown in U.S. Pat. No. 6,173,750 issued to Davis et al, as well as U.S. Pat. No. 5,671,530 issued to Combs et al. These patents disclose an apparatus that removes die from a vertically oriented wafer and presents the die for subsequent placement onto a PCB. Because the referenced Davis patent is intended to replace the traditional tape feeders mentioned above, it is designed to interface to the placement machine as if it were a standard tape and reel feeder.

The present invention is considered a further improvement to a direct die from wafer feeder used with automated pick-and-place equipment, particularly those systems requiring the manipulation and placement of numerous die at high speeds. The present invention includes, among other aspects and features, a novel means for holding, turning over, and parallel queuing of die or flip-chips using a multitude of vacuum ports and a rotatable picking member.

There are numerous methods of attaching a die to the substrate of a PCB. The most common method is to bond wires to the upward facing circuit of a die that has been previously placed and affixed to the substrate. Electrical connections are thereby facilitated with the "bonding" of wires to pads on the exposed surface of the die to corresponding contacts on the substrate. In an alternative method, solder bumps are placed on the die circuit and then the die is turned over or "flipped" so as the solder bumps are aligned with corresponding pads on the substrate. The mechanical and electrical connections are accomplished by melting the solder bumps within an oven. The process is well known in the art as a controlled-collapse chip connection, or simply the C-4 process. It is a common practice in the industry to refer to a flip-chip as a bumped bare die or chip, the term "flip" is appended to chip in as much as the bare die must be turned over during the delivery process so as the circuit side of the flip-chip contacts the PCB. In this specification the term "die" is used prior to turning the chip over, at which time the term flip-chip will generally be used.

The Davis U.S. Pat. No. 6,173,750 has an inherent maximum throughput governed by the concatenated steps of; (1) extracting, (2) flipping and (3) depositing onto the shuttle one die at a time. Furthermore, in the prior art, transference of the die from the wafer occurs only when the die shuttle is in the re-fill or loading position, hence when the shuttle is in the distal export location and waiting for the placement machine, the die extraction activity must remain in a wait state. Therefore, the inability to multiplex the "die picking from the wafer process" with the "die delivery to the placement machine process" significantly limits throughput. Accordingly the motivation for the present invention relies on the requirement to concurrently perform these operations, thusly providing flip-chips at a rate that is synchronous with the cycle time of the placement machine.

The present bare die feeder apparatus may not be as suitable for accelerated throughput requirements associated with circuit boards having a relatively high flip-chip component population, such as is the case with cell phones and similar miro-electronic devices. The metric for capacity is generally considered to be the total components which can be placed in a unit of time. Therefore the feeder cycle time is a function of the total number of feeders on the machine divided into the rated capacity of the placement machine. In the case of a multi-head placement machine the placement rate may often exceed the die feeder delivering throughput capabilities and accordingly the assembly process is required to enter a wait cycle that compromises productivity and thereby increases the overhead.

In these respects, the method for rapid bare die removal from a wafer according to the present invention is considered to be an improvement over the conventional concepts and designs of the prior art, and in so doing provides for an apparatus primarily developed for the purpose of the accelerated delivery of die as they are co-processed and queued for subsequent placement.

The present invention is directed towards a dual stage approach whereby flip-chips are removed from a wafer concurrently with the flip-chips being presented for placement. As described herein, one embodiment of the present invention is directed toward buffering the flipped-chips while the shuttle is being unloaded by the placement machine

SUMMARY OF THE INVENTION

In view of the foregoing limitations inherent in the known types of methods for delivering bare die now presented in the prior art, the present invention provides a new method for concurrent bare die removal from a wafer containing a plurality of flip-chips wherein a multiplexed or timeshared co-processing method can be utilized for the rapid throughput of die as they are removed from the wafer for subsequent placement.

The general purpose of the present invention, which will be described subsequently in greater detail, is to provide a new method for accelerating the die removal from a wafer that has many of the advantages of the method for delivering bare die mentioned heretofore and a novel feature that results in a new method for accelerated flip-chip delivery from a wafer which is not anticipated, rendered obvious, suggested, or even implied by any of the prior art method for delivering bare die, either alone or in any combination thereof.

To attain this, the present invention generally comprises a die acquisition station member, containing a nozzle, a die intermediate transfer station, containing a number of nozzles and a conveying method, such as a shuttle, which translates flip-chips placed on nozzles to a pick-up point. The acquisition member contains a nozzle having a suction port therein whereby a bumped bare die is secured as it is extracted and acquired from the wafer. A die intermediate transfer station has a quantity of nozzles, at a uniform pitch, whereby each nozzle retains a die as they are accumulated from the die acquisition member and waiting to be loaded onto the shuttle. This linear array of nozzles within the intermediate transfer station serves as a buffer to retain the die while the shuttle is away presenting die at the distal pick point. The shuttle also has a plurality of corresponding nozzles, with vacuum ports, orientated so as to be in direct alignment with the die transfer nozzles so that a group of flipped die can loaded in parallel from the nozzles of the transfer member onto the nozzles of the shuttle. This loading of the predisposed flipped die from the die transfer station onto the shuttle platform allows for the instantaneous and parallel loading of a group of flipped die onto the shuttle nozzles. Therefore, die subsequently migrate from the wafer as they are transitioned from the pick nozzle by releasing from the first plane and securing on the second plane by the die transfer station. Pneumatic flow valves enable the release and transfer of the flipped die from the wafer to the die transfer station, as well from the die transfer station to the shuttle. The die transfer station, having a multiple of nozzles, enables more than a single die to be picked and then retained while the shuttle is in the distal delivery position. This multi-nozzle die buffer array within the die transfer station offers a significant enhancement to the throughput capabilities by multiplexing the picking function with the presentation of flipped die to the placement machine.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a method for increasing the rate of throughput of bare die that have been removed from a wafer and turned over. This invention will serve to overcome the identified limitations inherent to the prior art of record.

An object of the present invention is to provide a method for rapid bare die removal and flipping from a wafer in order to provide die delivery cycle times that are capable of being synchronized with the high speed placement machines now available.

Another object is to provide a method for rapid bare die handling from a wafer that is capable of multiplexing the steps required for die extraction from the wafer.

Therefore the primary object of this patent is to provide a method for the accelerated bare die removal from a wafer that will improve the overall throughput and die availability and accordingly will serve to coordinate the feeder with the placement machine, exclusive of halt routines encountered when the demand for flip-chips exceeds the die delivery capabilities.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

Figure 1:
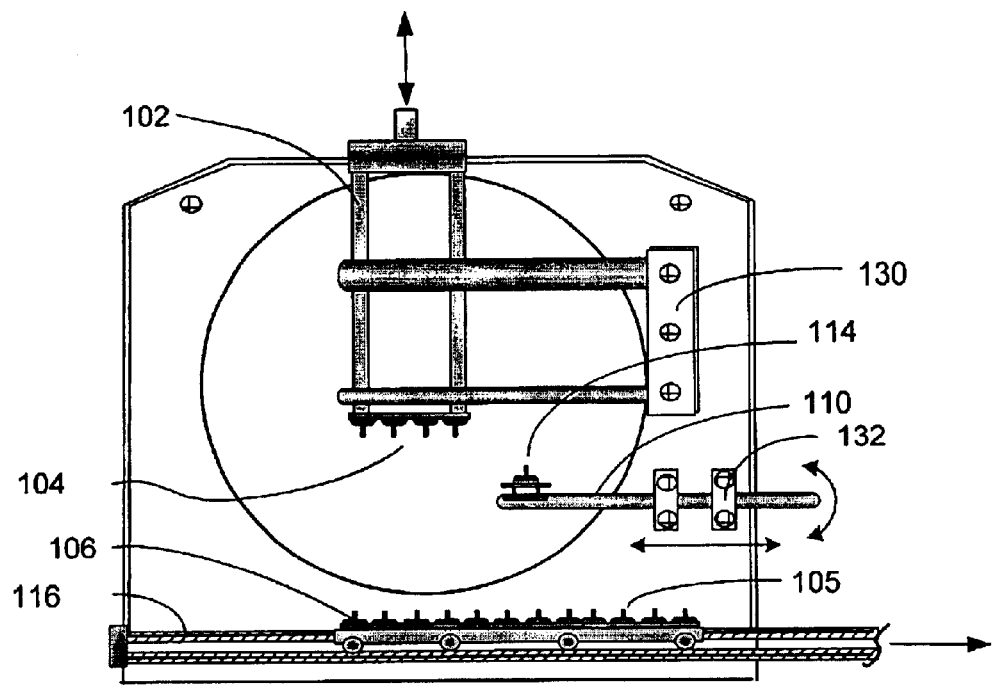
FIG. 1 shows a detailed frontal planar view depicting the relationship of the primary elements of the die handling mechanisms.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements. As used herein the term die is intended to include various embodiments of electrical, electromechanical, mechanical or other components that may be formed through a wafer processing technique and subsequently separated into discrete components. Therefore it is also intended, however, that die are not limited to semiconductor components, but may be any similar devices (e.g., mirrors, micro-electromechanical systems (MEMS), micro-optical electrical module (MOEM)) which are formed in an array and presented in the same manner as semiconductor components in a wafer array. Furthermore a die contained on a wafer may include post processing features such as, but not limited to, chip scale packaging (CSP), wafer level processing (WLP), passivation layers and alike.

In accordance with the present invention there is disclosed a die handling method, uses in conjunction with a wafer and a die feeder, (see U.S. Pat. No. 5,976,306, previously incorporated by reference) having four specific elements; (1) a die acquisition nozzle 114, (2) a die flipping arm 110, (3) an intermediate holding station 102 and (4) a flip-chip shuttle 106.

Figure 2:
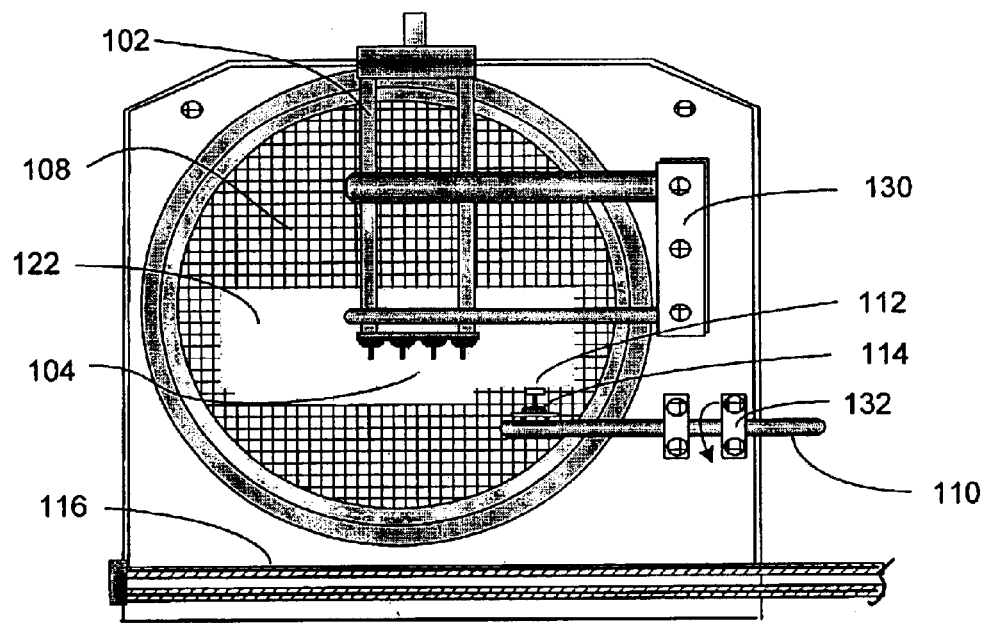
FIG. 2 is a detailed frontal view showing the wafer and one extracted die rotated 90 degrees into the pre-transfer position.

Turning now to FIGS. 1 and 2, a die delivery apparatus (e.g., similar to Applicant's Direct Die Feeder, U.S. Pat. Nos. 6,173,750 and 6,554,128, disclosed above and incorporated by reference); is illustrated showing the operative elements for the accelerated removal of die from a wafer 108. The wafer 108 is loaded into carriage assembly within the bare die feeder that has the capability of indexing the die to the acquisition nozzle in both the x and y directions using the Cartesian coordinate method. In FIG. 1 the die removal nozzle 114 is mounted within the die flipping member 110 and is operatively coupled in such a manner to allow the die removal nozzle 114 to extend and retract. The die removal nozzle 114 preferably includes an interchangeable tip made of an elastomer, or similarly conformable polymer material, for sealing onto the irregular surface of the bumped die 112. Additionally, the nozzle is selected to accommodate a variety of geometric form factors according to die specific dimensions. It should be appreciated that there can be other means for holding a die, such as a mechanical gripper or collate, as well as a magnetic head. In the preferred embodiment the die removal nozzle 114, includes an airway or passage where air may pass from a common vacuum and pressure source (not shown) in order to secure the bare die as it is removed from the wafer 108. Pick head arm 110 is rotatably connected to bracket 132 and can be angularly driven 90 degrees in a clockwise direction allowing the die removal nozzle 114 to be perpendicular to the frontal plane of wafer 108 for die removal. Now, referring to FIG. 2, the die removal nozzle 114 extends towards, and contacts, the surface of the wafer 108 and subsequently secures the bare die 112 as it is being lifted from the wafer 108. The applied vacuum secures and retains the die 112 upon the die removal nozzle 114 as the die is released from the adhesive coated backing material 122 on which the wafer 108 has been previously affixed for sawing into individual die. It should be appreciated that it is conceivable to have more than one die removal nozzle 114 capable of removing a number of die 112, in unison or singularly, from the wafer 108. Accordingly, having now acquired the die 112 onto one or more die removal nozzles 114, the die flipping member 110 rotates 90 degrees in a counter clockwise direction about an axis parallel to the plane of the wafer 108. In practice we now have the die correctly orientated for a flip-chip application.

Figure 3:
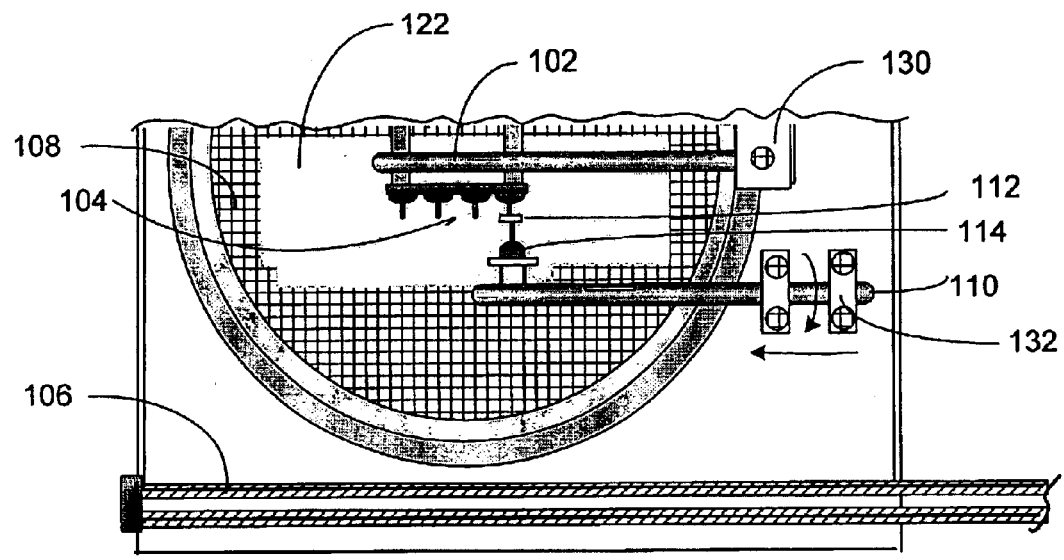
FIG. 3 is a partial frontal view showing the die to flip-chip transfer function.
Figure 4:
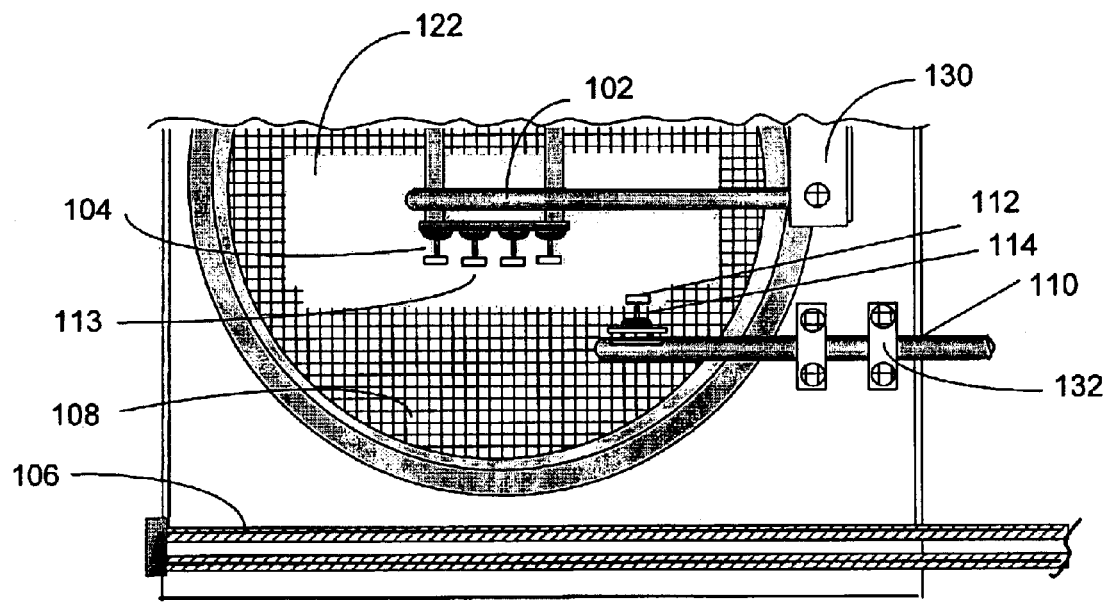
FIG. 4 exhibits an illustration fully loaded transfer mechanism awaiting the shuttle.

Referring now to FIG. 3 there is depicted an intermediate holding station 102 comprising an array of flip-chip nozzles 104, all of which commonly communicate to a pneumatic manifold. The pitch, or center to center distance between the nozzles 104, is equivalent to, or a multiple, of the pitch of the transport nozzles 105 within the die shuttle 106 (FIG. 1). Having a plurality of nozzles enables the die transfer to provide a multitude of holding position in order to buffer and stage the die while the shuttle 106 is predisposed exporting flip-chips to the placement machine. The intermediate holding station 102 is slideably engaged to bracket 130 and is operatively coupled to a linear drive (not shown) that provides for motion in the Y direction only. On the other hand the die flipping member 110 has two degrees of motion; theta and X as previously discussed, to translate the die to a position immediately below the next available flip-chip nozzle 104 of the nozzle array within the intermediate holding station 102. Retention of the die is passed from the die removal nozzle 114 to the flip-chip nozzle 104 once the holding station 102 and the flipping member 110 are in direct alignment. The die removal nozzle is once again extended so as the die 110 is captured therebetween. The die transfer process is completed once positive air pressure is applied to the die removal nozzle holding the first side and the vacuum port within the flip-chip nozzle 104 has secured the second side of the flip-chip. The aforementioned die extraction and transfer process is reiterated until each of the flip-chip nozzles 104 have acquired a flip-chip from the die removal nozzle as shown in FIG. 4.

Figure 5:
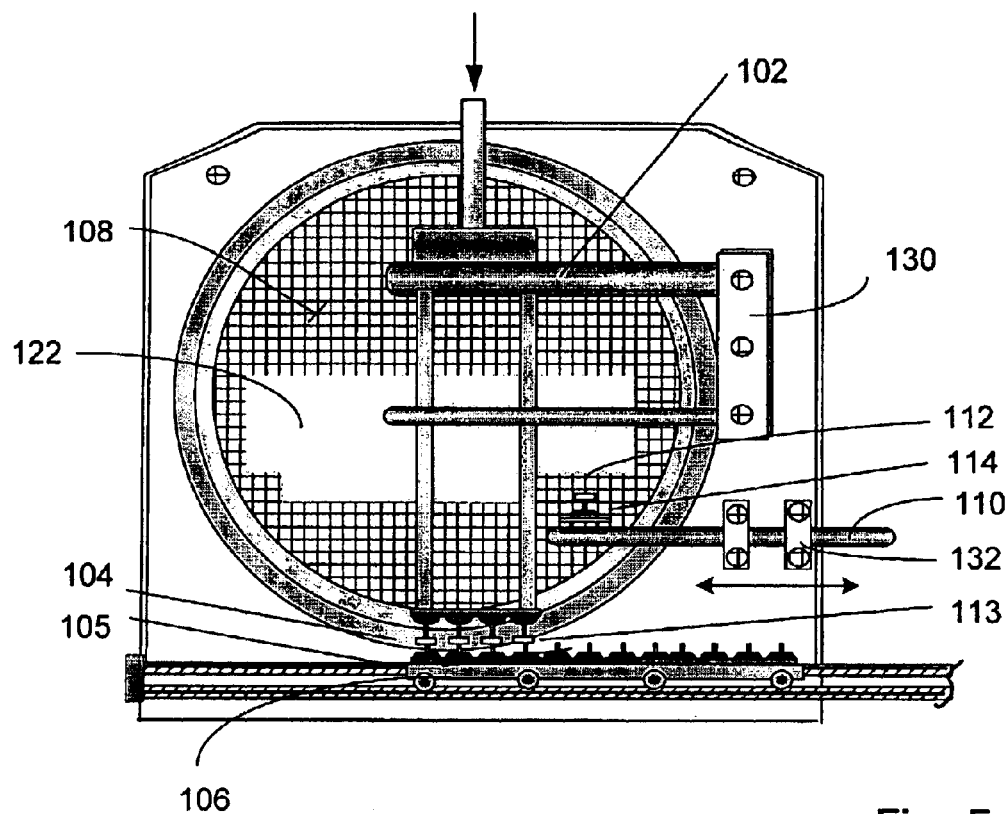
FIG. 5 depicts the parallel loading of the shuttle assembly.

Referring now to FIG. 5, flip-chip shuttle 106 includes a quantity of transfer nozzles 105 equal to or greater than the number of flip chip nozzles 104 of the holding station 102. The holding station 102 is operatively coupled to a motor (not shown) that linearly translates the flip-chip nozzles 104 to the transport nozzles 105 of the shuttle 106. The flip-chip to shuttle transfer commences upon the arrival and positioning of the shuttle 106 directly in line with and underneath the flip-chip nozzles 104. The holding station 102 lowers the flip-chip nozzles to a position immediately above the transfer nozzles so as the flip-chips 113 are sandwiched between the nozzles 104 of the holding station 102 and the nozzles 105 of the shuttle 106. Air flow valves (not shown) now provide air pressure to release and transfer the flip-chips 113 from the flip-chip nozzles 104 to the transport nozzles 105 of the shuttle 106. Loading of the shuttle in this manner may continue as the next group of flip-chips are collected onto the holding station 102, however, based on the specific requirements of the placement machine, it is possibly more time efficient to dispatch the shuttle to the pick point after only loading a single group of flip-chips. Accordingly, it can be appreciated that the number of flip-chips in a group, as well as the number of groups transported by the shuttle 106, is a function of evenly multiplexing the die removal cycle time with the die delivery cycle time.

Figure 6:
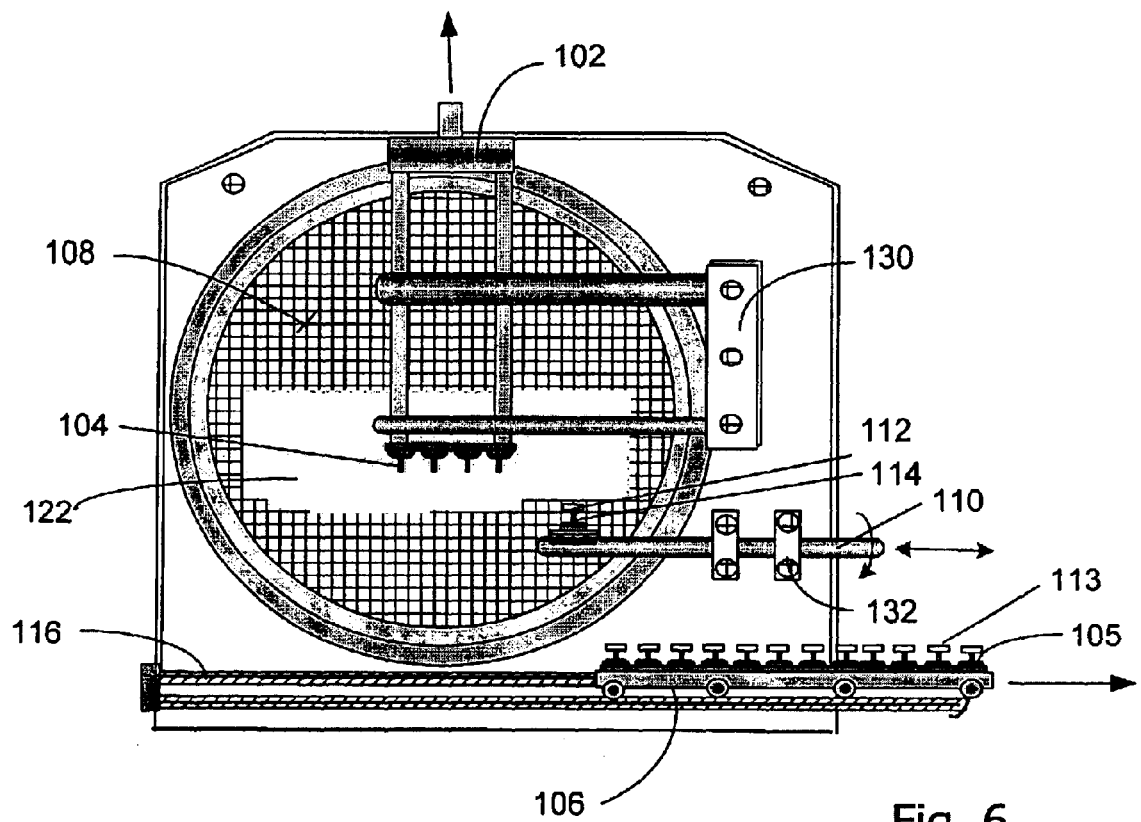
FIG. 6 shows the loaded shuttle departing for the pick point.

As seen in FIG. 6 the loading of the shuttle continues in this manner until the specified number of flip-chips have been placed onto the shuttle, at which time the shuttle 106 transports the die 113 to the distal pick-up location (not shown) or more specifically as disclosed within the Applicant's U.S. Pat. No. 6,554,128 "DIE SHUTTLE CONVEYOR AND NEST THEREFOR" previously incorporated herein by reference.

Figure 7:
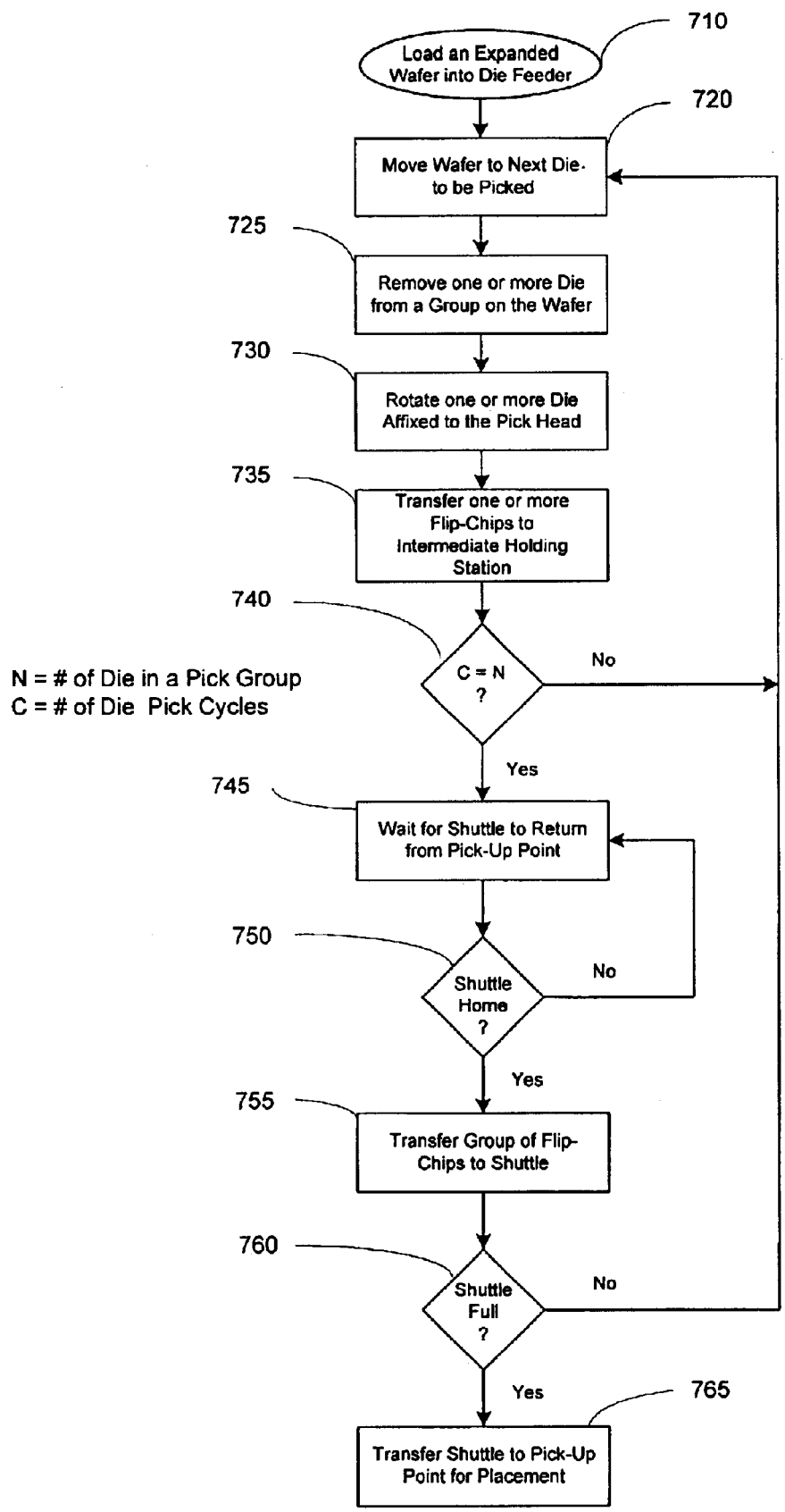
FIG. 7 is a process flow chart indicating the required steps

And lastly, referring to FIG. 7, the above process is depicted in a flow chart format for further clarity of the significant steps to accomplish a multiplexed method for the feeding of die. A wafer is loaded into the feeder at 710 and is moved by the feeder x-y carriage assembly to a location that correlates to the position of a group of known to be good die at 720. Now referencing step 725 and 730 the die is released from the wafer, rotated and presented to the holding station in step 735. This will continue until the intermediate holding station is filled with flip chips, at which time the shuttle will be loaded when available.

The present invention is not limited to a shuttle carrying twelve nests as depicted in the drawings, a shuttle assembly 106 may contain a range of nozzles from possibly 2 to 24 and preferably a multiple of the number of the intermediate holding station nozzles. Furthermore, there is no requirement that each nozzle must have there own die at any particular time, for example, if the flip-chips to be conveyed are larger than the spacing between the nozzles, then two or more nozzles might be employed to share one flip-chip. It can be further appreciated that by definition the number of die in a pick grouping is equal to or less than the number of nozzles 104 contained within the intermediate holding station 102.

It will be recognized that the novel embodiments described herein provide for the capitalization of previously idle time to extract and flip and buffer the die in a holding queue in order to rapidly deploy the pending die onto the shuttle.

In recapitulation, the sawn and expanded wafer contains a multitude of cingulated die which are removed by the pick head. The pick head working in conjunction with the pick arm manipulates the die from the backing tape and flips it over. The pick head then transfers the flip-chip to the intermediate holding station that has the ability to buffer a multitude of die and thereby increase the throughput by multiplexing the dependant processes of die removal from the wafer with die delivery to the placement machine. The intermediate holding station nozzles in turn places the flip-chip, with the active side down, onto the shuttle for delivery to the placement machine.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A die handling apparatus for removing and holding a select group of die from a semiconductor wafer, each of said die having a first and a second planar surface parallel to a plane of the semiconductor wafer, comprising:

a die acquisition member, located within an acquisition station, having a first gripper for securing the first planar surface of a die and removing said die from said wafer, said die acquisition member rotating so that the first and second planar surface of the die is oriented in a manner substantially perpendicular to the plane of the wafer;

a die intermediary holding station having a first plurality of grippers for receiving and buffering a plurality of die received from the first gripper, such that the retention of said plurality of die is transferred from contact with the first planar surface by said first gripper to the second planar surface of said plurality of die by the first plurality of grippers; and a die conveyance station for receiving and transporting the plurality of die from the first plurality of grippers, where the plurality of die are received in parallel from the first plurality of grippers at said die intermediary holding station and transferred to a corresponding second plurality of grippers at said die conveyance station, such that the retention of the plurality of die is transferred from contact with the second planar surface by said first plurality of grippers to the first planar surface by the second plurality of grippers.

2. The die handling apparatus of claim 1 wherein at least one gripper is a vacuum nozzle.

3. The die handling apparatus of claim 2 wherein the at least one gripper is the first gripper, and where said vacuum nozzle is moveable relative to the die acquisition member.

4. The die handling apparatus of claim 1 wherein said second plurality of grippers in said conveyance station are associated with a die shuttle and include nozzles with vacuum ports therein.

5. The die handling apparatus of claim 4 wherein said first plurality of grippers comprise nozzles having vacuum ports therein, and where the plurality of die are momentarily queued pending availability of the die shuttle.

6. The die handling apparatus of claim 5 wherein the shuttle translates between first position in proximity to the die intermediary holding station and a second position at a distal pick-up point for acquisition of the plurality of die thereon by an assembly machine to which the die handling apparatus is attached.

7. The die handling apparatus of claim 1 wherein said die is a flip-chip.

8. A method for handling a select group of die from a wafer having a plurality of die formed thereon, each of said die having a first and a second planar surface parallel to plane the wafer, comprising the steps of:

a) translating said wafer to an acquisition station such that a selected die is positioned within reach of a die picking nozzle;

b) retrieving the die from said wafer at said acquisition station while a shuttle is located at a distal position suitable for exporting die to an assembly machine;

c) turning said die at least 90 degrees about an axis substantially parallel to the the wafer;

d) transferring the die to an intermediary holding station having a plurality of die holding grippers associated therewith;

e) repeating steps (a)–(d) above until a plurality of die are present on the plurality of die holding grippers;

awaiting for the shuttle to return to a load position adjacent the intermediary holding station;

transferring the accumulated die on the intermediary holding station, in parallel, to corresponding transfer nozzles on the shuttle; and moving the shuttle to the distal position suitable for exporting the die present thereon.

9. The method of claim 8 further comprising the step of:

determining the location of at least one of said die prior to retrieving a first die.

10. The method of claim 9 wherein said step of translating said wafer includes the step of:

imparting relative motion between the wafer and the die picking nozzle so as to cause an available die on the wafer to be within reach of the die picking nozzle.

* * * * *